United States Patent
Sarigiannis et al.

(10) Patent No.: US 7,498,057 B2
(45) Date of Patent: *Mar. 3, 2009

(54) DEPOSITION METHODS

(75) Inventors: Demetrius Sarigiannis, Boise, ID (US); Garo J. Derderian, Boise, ID (US); Cem Basceri, Boise, ID (US); Gurtej S. Sandhu, Boise, ID (US); F. Daniel Gealy, Kuna, ID (US); Chris M. Carlson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 763 days.

This patent is subject to a terminal disclaimer.

(21) Appl. No.: 11/075,017

(22) Filed: Mar. 8, 2005

(65) Prior Publication Data

US 2005/0147751 A1    Jul. 7, 2005

Related U.S. Application Data

(63) Continuation of application No. 10/222,304, filed on Aug. 15, 2002, now Pat. No. 6,890,596.

(51) Int. Cl.
*C23C 16/04* (2006.01)

(52) U.S. Cl. .............. 427/248.1; 427/535; 427/569; 427/237

(58) Field of Classification Search ........ 427/248.1, 427/535, 569, 237; 134/1.1, 22.1
See application file for complete search history.

(56) References Cited

U.S. PATENT DOCUMENTS

| 5,225,032 A | 7/1993 | Golecki |
| 5,693,179 A * | 12/1997 | Blackburn et al. ............ 216/59 |
| 5,766,363 A * | 6/1998 | Mizuno et al. .............. 118/725 |
| 5,879,459 A | 3/1999 | Gadgil et al. ............... 118/715 |
| 5,925,411 A | 7/1999 | van de Ven et al. ....... 427/248.1 |
| 5,972,430 A | 10/1999 | DiMeo, Jr. et al. ...... 427/255.32 |
| 6,015,597 A | 1/2000 | David ......................... 427/577 |
| 6,077,562 A * | 6/2000 | Dornfest et al. ........ 427/255.28 |

(Continued)

FOREIGN PATENT DOCUMENTS

WO    WO 01/27347 A1    4/2001    ................... 16/44

(Continued)

OTHER PUBLICATIONS

U.S. Appl. No. 10/132,003, filed Apr. 2002, Dando.

(Continued)

*Primary Examiner*—Bret Chen
(74) *Attorney, Agent, or Firm*—Wells St. John P.S.

(57) ABSTRACT

A deposition method includes positioning a substrate within a deposition chamber defined at least in part by chamber walls. At least one of the chamber walls comprises a chamber surface having a plurality of purge gas inlets to the chamber therein. A process gas is provided over the substrate effective to deposit a layer onto the substrate. During such providing, a material adheres to the chamber surface. Reactive purge gas is emitted to the deposition chamber from the purge gas inlets effective to form a reactive gas curtain over the chamber surface and away from the substrate, with such reactive gas reacting with such adhering material. Further implementations are contemplated.

34 Claims, 4 Drawing Sheets

U.S. PATENT DOCUMENTS

| | | | |
|---|---|---|---|
| 6,174,377 B1 | 1/2001 | Doering et al. | 118/729 |
| 6,197,120 B1 | 3/2001 | David | 118/716 |
| 6,200,893 B1 | 3/2001 | Sneh | 438/685 |
| 6,270,572 B1 | 8/2001 | Kim et al. | 117/93 |
| 6,287,965 B1 | 9/2001 | Kang et al. | 438/648 |
| 6,301,434 B1 | 10/2001 | McDiarmid et al. | 392/416 |
| 6,305,314 B1 | 10/2001 | Sneh et al. | 118/723 |
| 6,355,561 B1 | 3/2002 | Sandhu et al. | 438/676 |
| 6,387,185 B2 | 5/2002 | Doering et al. | 118/729 |
| 6,391,785 B1 | 5/2002 | Satta et al. | 438/704 |
| 6,403,156 B2 | 6/2002 | Jang et al. | 427/255.34 |
| 6,426,307 B2 | 7/2002 | Lim | 438/778 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,286 B1 | 11/2002 | Frijlink | 118/719 |
| 6,475,910 B1 | 11/2002 | Sneh | 438/685 |
| 6,482,262 B1 | 11/2002 | Elers | 117/84 |
| 6,482,476 B1 | 11/2002 | Liu | 427/535 |
| 6,485,783 B1 * | 11/2002 | Bailey et al. | 427/248.1 |
| 6,534,395 B2 | 3/2003 | Werkhoven et al. | 438/627 |
| 6,585,823 B1 | 7/2003 | Van Wijck | 117/89 |
| 6,586,343 B1 | 7/2003 | Ho et al. | 438/758 |
| 6,589,886 B2 | 7/2003 | Kim et al. | 438/758 |
| 6,590,251 B2 | 7/2003 | Kang et al. | 257/310 |
| 6,602,784 B2 | 8/2003 | Sneh | 438/680 |
| 6,613,587 B1 | 9/2003 | Carpenter et al. | 438/4 |
| 6,613,695 B2 | 9/2003 | Pomarede et al. | |
| 6,620,253 B1 | 9/2003 | Dando et al. | 118/728 |
| 6,620,723 B1 | 9/2003 | Byun | 438/627 |
| 6,630,401 B2 | 10/2003 | Sneh | 438/680 |
| 6,638,862 B2 | 10/2003 | Sneh | 438/685 |
| 6,664,192 B2 | 12/2003 | Satta et al. | 438/704 |
| 6,673,701 B1 | 1/2004 | Marsh et al. | 438/493 |
| 6,696,157 B1 | 2/2004 | David et al. | 428/408 |
| 6,696,368 B2 | 2/2004 | Derraa et al. | 438/761 |
| 6,720,027 B2 | 4/2004 | Yang et al. | 427/123 |
| 6,727,169 B1 | 4/2004 | Raaijmakers et al. | 438/622 |
| 6,730,367 B2 | 5/2004 | Sandhu | |
| 6,746,952 B2 | 6/2004 | Derraa et al. | 438/627 |
| 6,753,271 B2 | 6/2004 | Sarigiannis et al. | 438/785 |
| 6,821,347 B2 | 11/2004 | Carpenter et al. | |
| 6,890,596 B2 * | 5/2005 | Sarigiannis et al. | 427/248.1 |
| 7,107,998 B2 * | 9/2006 | Greer et al. | 134/22.1 |
| 7,229,666 B2 * | 6/2007 | Mardian et al. | 427/248.1 |
| 2001/0024387 A1 | 9/2001 | Raaijmakers et al. | 365/200 |
| 2001/0041250 A1 | 11/2001 | Werkhoven et al. | 428/212 |
| 2001/0050039 A1 | 12/2001 | Park | 117/102 |
| 2001/0054381 A1 | 12/2001 | Umotoy et al. | 118/715 |
| 2002/0086111 A1 | 7/2002 | Byun et al. | 427/255.394 |
| 2002/0108570 A1 | 8/2002 | Lindlors | |
| 2002/0108714 A1 | 8/2002 | Doering et al. | 156/345.51 |
| 2002/0173054 A1 | 11/2002 | Kim | |
| 2002/0173190 A1 | 11/2002 | Pomarede et al. | |
| 2002/0187256 A1 | 12/2002 | Elers | 427/99 |
| 2003/0031807 A1 | 2/2003 | Elers et al. | 427/569 |
| 2003/0032281 A1 | 2/2003 | Werkhoven et al. | 438/640 |
| 2003/0077388 A1 * | 4/2003 | Byun | 427/255.28 |
| 2003/0085424 A1 | 5/2003 | Bryant et al. | 257/347 |
| 2003/0108674 A1 | 6/2003 | Chung et al. | 427/255.394 |
| 2003/0129826 A1 | 7/2003 | Werkhoven et al. | 438/627 |
| 2003/0143328 A1 | 7/2003 | Chen et al. | 427/255.28 |
| 2003/0183171 A1 | 10/2003 | Sneh et al. | 118/724 |
| 2004/0083959 A1 | 5/2004 | Carpenter et al. | 118/715 |
| 2004/0137728 A1 | 7/2004 | Gallagher et al. | 438/689 |
| 2005/0037597 A1 | 2/2005 | Nguyen et al. | |
| 2006/0265100 A1 | 11/2006 | Li | |

FOREIGN PATENT DOCUMENTS

| | | | | |
|---|---|---|---|---|
| WO | WO 01/29280 A1 | 4/2001 | | 16/32 |
| WO | WO 01/29893 A1 | 4/2001 | | 21/768 |
| WO | WO 01/66832 A2 | 9/2001 | | 25/14 |
| WO | PCT/US03/22804 | 7/2003 | | |
| WO | WO 2004/011693 A1 | 2/2004 | | 16/44 |

OTHER PUBLICATIONS

U.S. Appl. No. 10/132,767, filed Apr. 2002, Dando.
U.S. Appl. No. 10/150,388, filed May 2002, Mardian et al.
U.S. Appl. No. 10/163,689, filed Jun. 2002, Derderian et al.
U.S. Appl. No. 10/208,314, filed Jul. 29, 2002, Castrovillo et al.

* cited by examiner

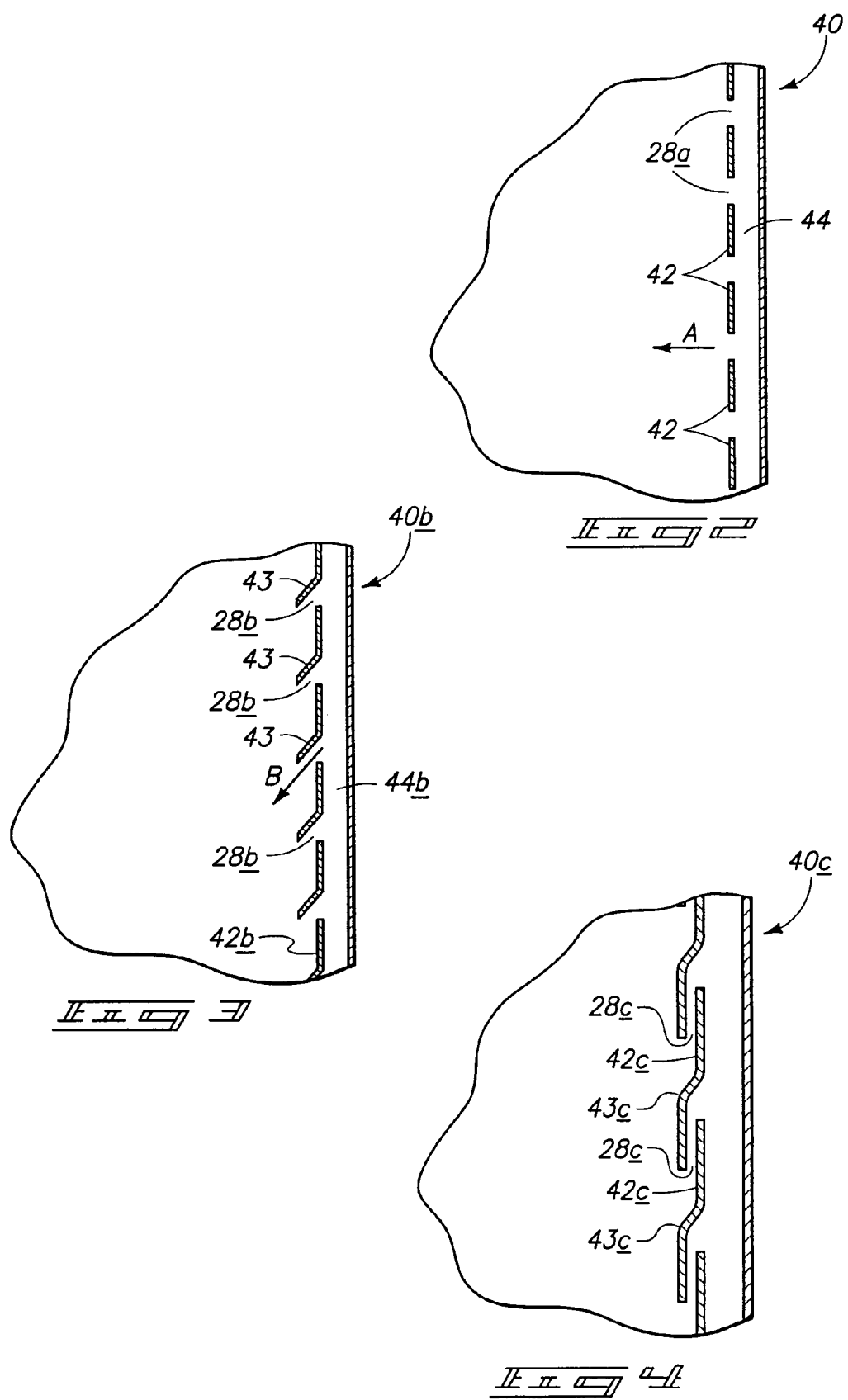

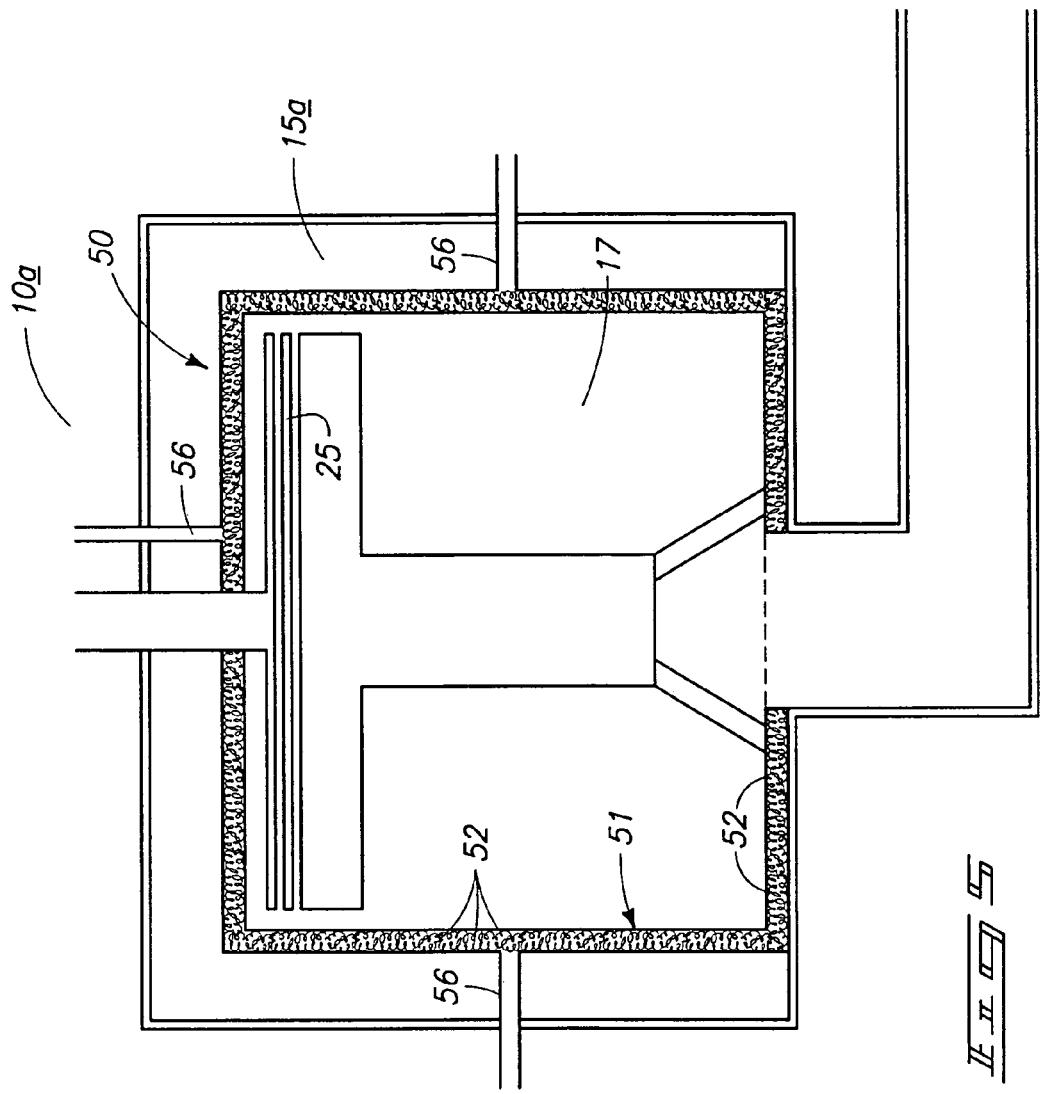

DEPOSITION METHODS

RELATED PATENT DATA

This patent resulted from a continuation application of U.S. patent application Ser. No. 10/222,304, filed Aug. 15, 2002, now U.S. Pat. No. 6,890,596 entitled "Deposition Methods", naming Demetrius Sarigiannis, Garo J. Derderian, Cem Basceri, Gurtej S. Sandhu, F. Daniel Gealy, and Chris M. Carlson as inventors, the disclosure of which is incorporated by reference.

BACKGROUND OF THE INVENTION

Semiconductor processing in the fabrication of integrated circuitry typically includes the deposition of layers on semiconductor substrates. Exemplary processes include physical vapor deposition (PVD), and chemical vapor deposition (CVD) which herein includes atomic layer deposition (ALD). With typical ALD, successive mono-atomic layers are adsorbed to a substrate and/or reacted with the outer layer on the substrate, typically by successive feeding of different precursors to the substrate surface.

Chemical and physical vapor depositions are typically conducted within chambers or reactors which retain a single substrate upon a wafer holder or susceptor. The chambers include internal walls and other internal components which can undesirably have deposition product deposited thereupon in addition to the substrate. This is particularly problematic in ALD and other CVD processes, yet can also occur with PVD chambers. One existing method of protecting or preserving the internal chamber walls and other components is to shield such from the deposition material with one or more removable liners or shields. The liners might be received immediately adjacent or against the internal chamber walls or other surfaces. Alternately, the liners might be displaced from the wall or other surfaces, thereby defining an appreciably reduced volume chamber, or subchamber, within which the substrate is received for deposition. One advantage of using liners and shields is that they can be periodically replaced with new or cleaned liners, thereby extending the life of the deposition chambers and components therein. Further and regardless, the spent liners and shields can typically be removed and replaced much more quickly than the time it would take to clean the internal chamber walls and other components at given cleaning intervals.

An exemplary ALD method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor which is not adhering to the substrate from the chamber. Subsequently, a second vapor precursor different from the first is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

It is a desired intent or effect of the purging to remove gas molecules that have not adsorbed to the substrate or unreacted gas or reaction by-products from the chamber to provide a clean reactive surface on the substrate for the subsequent precursor. In the context of this document, a reaction by-product is any substance (whether gas, liquid, solid or mixture thereof) which results from reaction of any deposition precursor flowing to the chamber and that is not desired to be deposited on the substrate. Further in the context of this document, an intermediate reaction by-product or reaction intermediate by-product is a reaction by-product formed by less than complete reaction of a precursor to form a desired monolayer on the substrate. Where there is a great degree of varying topography and/or there are high aspect ratio features on the substrate, it can be difficult to move the unreacted gases or reaction by-products from deep within openings for ultimate removal from the chamber. Further, certain reaction by-products, particularly intermediate reaction by-products, may not be gaseous and may not completely react to form gaseous reaction by-products in the typical short precursor pulse times. Accordingly, the purge gas pulse may not be effective or sufficient in removing such intermediate reaction by-products from the substrate and chamber.

For example, consider that in an atomic layer deposition of titanium nitride using $TiCl_4$ and $NH_3$, the desired deposition product is TiN with HCl gas being the desired principle gaseous by-product. Consider also that there might be reaction intermediate by-products which might, even if gaseous, be difficult to remove from substrate openings. Further, if certain reaction intermediate by-products are solid and/or liquid phase prior to HCl formation, complete removal can be even more problematic where less than complete reaction to TiN and HCl occurs.

Consider also the atomic layer deposition of $Al_2O_3$ using trimethylaluminum (TMA) and ozone as alternating deposition precursors. Apparently in such deposition, achieving an effective ozone precursor feed can be somewhat of a challenge due to the limited lifetime of ozone within the chamber. Specifically, an ozone molecule is an inherently unstable, reactive form of oxygen which can rapidly dissociate and/or combine with another ozone molecule to form three $O_2$ molecules. Regardless, a desired goal in the ozone feed is adsorption of oxygen atoms from the $O_3$ to the surface of the substrate with $O_2$ as the reaction by-product which is driven off. Of course, the $O_2$ which forms deep within openings on the substrate has to be removed therefrom while more $O_3$ needs to get into the openings to form a complete monolayer of oxygen atoms adhering to the substrate. In other words, the $O_2$ which forms is trying to get out while more $O_3$ is trying to get in.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

In one implementation, a deposition method includes positioning a substrate within a deposition chamber defined at least in part by chamber walls. At least one of the chamber walls comprises a chamber surface having a plurality of purge gas inlets to the chamber therein. A process gas is provided over the substrate effective to deposit a layer onto the substrate. During such providing, a material adheres to the chamber surface. Reactive purge gas is emitted to the deposition chamber from the purge gas inlets effective to form a reactive gas curtain over the chamber surface and away from the substrate, with such reactive gas reacting with such adhering material.

In one implementation, a deposition method includes positioning a substrate within a deposition chamber defined at least in part by chamber walls. The deposition chamber has a component received therein internally of the chamber walls.

The component has a surface exposed to the chamber. The surface has a plurality of purge gas inlets to the chamber therein. A process gas is provided over the substrate effective to deposit a layer onto the substrate. During such providing, a material adheres to the chamber surface. Reactive purge gas is emitted to the deposition chamber from the purge gas inlets effective to form a reactive gas curtain over the component surface within the deposition chamber and away from the substrate, with such reactive gas reacting with such adhering material.

Further implementations are contemplated.

BRIEF DESCRIPTION OF THE DRAWINGS

Preferred embodiments of the invention are described below with reference to the following accompanying drawings.

FIG. 2 is an enlarged sectional view of a portion of a chemical vapor deposition apparatus usable in accordance with an aspect of the invention FIG. 3 is an enlarged sectional view of a portion of an alternate embodiment chemical vapor deposition apparatus usable in accordance with an aspect of the invention.

FIG. 4 is an enlarged sectional view of a portion of another alternate embodiment chemical vapor deposition apparatus usable in accordance with an aspect of the invention.

FIG. 5 is a diagrammatic sectional view of an alternate chemical vapor deposition apparatus usable in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
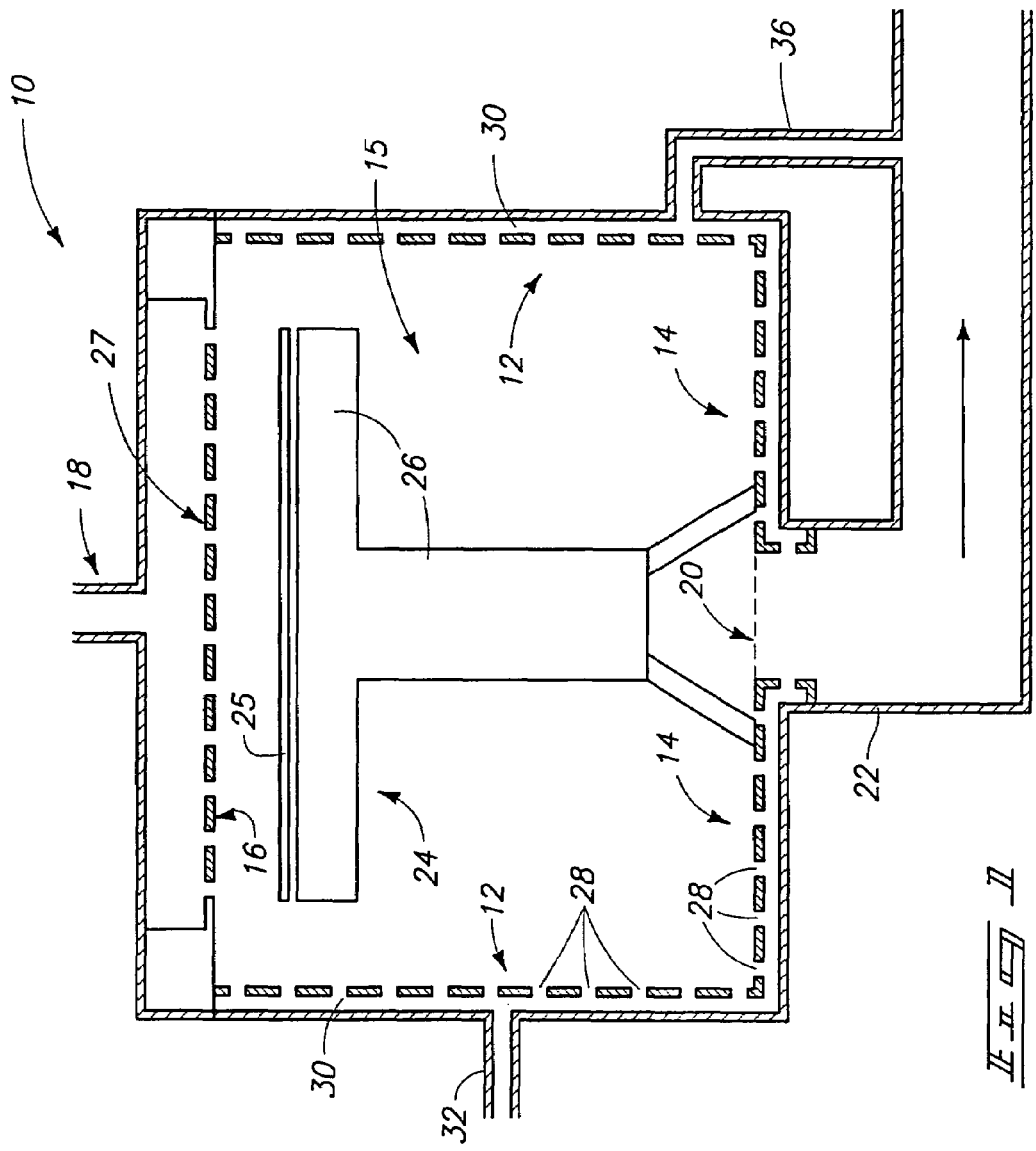
FIG. 1 is a diagrammatic sectional view of a chemical vapor deposition apparatus usable in accordance with an aspect of the invention.

By way of example only, FIG. 1 depicts an exemplary embodiment chemical vapor deposition apparatus 10 usable in accordance with methodical aspects of the invention. Any other apparatus, whether existing or yet-to-be-developed, could of course also/alternatively be utilized. Apparatus 10 includes a chamber 15 defined at least in part by chamber walls 12, 14 and 16. Wall or walls 12 comprise a chamber sidewall, wall or walls 14 comprise a chamber base wall, and wall or walls 16 comprise a chamber top wall. Chamber 15 includes at least one process chemical inlet 18 thereto, and an outlet 20 feeding therefrom. Outlet 20 feeds to a foreline 22 for connection with a vacuum pump (not shown). A suitable substrate holder 24 is provided within chamber 15. Such includes some suitable support structure 26, and is illustrated as receiving a substrate 25, preferably a semiconductor substrate, thereatop. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Process gas inlet 18 is diagrammatically shown as feeding to a showerhead 27 associated with a lid of the apparatus for providing one or more process gasses to substrate 25 for deposition of a material thereon.

Chamber sidewalls 12 and chamber base walls 14 are depicted as having chamber surfaces having a plurality of purge gas inlets 28 to the chamber formed therein. The depicted purge gas inlets are separate or different from process gas inlet 18. A plenum chamber 30 is formed behind walls 12, 14 and is fed by a purge gas inlet passageway 32, which is thereby in fluid communication with purge gas inlets 28. In preferred implementations, walls 12, 14 are constructed of highly porous materials, such as sintered metal particles or fibers, low density teflon, or other synthetic organic and/or inorganic materials, and by way of example only. Material selection would ideally be based on intended process chemistries. Further by way of example only, walls 12, 14 might be constructed to form a screen-like mesh, with pores/outlets 28 being defined by interstices thereof. The pore sizes of the material would depend on material characteristics and deposition process characteristics. Exemplary pore sizes include from tens of microns to tens of Angstroms. Further by way of example only, walls 12, 14 might comprise an essentially solid, hard, planar wall surface having a plurality of openings 28 drilled or otherwise formed therein, such as is shown. In FIG. 1, the chamber surface having the plurality of purge gas inlets 28 is essentially formed on and constitutes both the chamber sidewall and the chamber base wall. Further by way of example only, such purge gas inlets might alternately be included only on either the sidewall or base wall, and the chamber surface can be considered as being only a portion or portions thereof. Further, purge gas inlets might also be provided on a top wall of chamber 15, for example in manners described herein, and in accordance with U.S. patent application Ser. No. 09/805,620, now published as 2004/0083959 A1, filed on Mar. 13, 2001, entitled "Chemical Vapor Deposition Apparatus and Deposition Methods", listing Craig M. Carpenter and Ross S. Dando as inventors, and which is hereby incorporated by reference.

As depicted, the purge gas inlets are substantially uniformly distributed over the chamber surface over which such are received. Further and/or additionally, purge gas inlets 28 might all be of substantially constant size, or of at least two inlet sizes. In one preferred embodiment, at least some of purge gas inlets 28 which are further from chamber outlet 20 are larger than at least some of the purge gas inlets 28 which are closer to chamber outlet 20. Such provides one manner by which, if desired, a greater volumetric flow of purge gas can be provided proximate the respective wall surfaces further from chamber outlet 20 than closer thereto. A purge gas outlet passageway 36 is depicted as extending from purge gas inlet passageway 32, 30 to foreline 22, thereby by-passing the plurality of purge gas inlets 28. Appropriate valving (not depicted) might, of course, be associated with passageway 36 or any other of the depicted passageways/inlets/outlets. A purge gas outlet passageway might be included to assist in control of the flow rate and pressure within plenum chamber 30 and, thereby, also from purge gas inlets 28.

By way of example only, FIGS. 2, 3 and 4 depict exemplary alternate purge gas inlets 28. For example, FIG. 2 depicts an exemplary chamber wall 40 having a chamber surface 42 having a plurality of purge gas inlets 28a received therein. Such are depicted as comprising openings extending from a purge gas inlet passageway 44 within wall 40 and which would be exposed to a deposition chamber, for example deposition chamber 15. Accordingly, the exemplary depicted purge gas inlets 28a in such embodiment (and inlets 28 in the FIG. 1 embodiment) are configured for discharging purge gas to the chamber in a direction which is substantially transverse, for example in a direction "A" to chamber surface 42. In the context of this document, "a direction substantially transverse" is defined to mean anything from perfectly perpendicular (90°) to the chamber surface to, but not including, 45° from the chamber surface.

FIG. 3 depicts an exemplary alternate embodiment chamber wall 40b. Like numerals from the FIG. 2 described embodiment are utilized where appropriate, with differences being indicated by the suffix "b" or with different numerals. Purge gas inlets 28b are depicted as being configured for discharging purge gas to the chamber in a direction substantially along chamber surface 42b. In the context of this document, "substantially along" means from 45° to parallel with the chamber surface. In the depicted exemplary FIG. 3 embodiment, chamber surface 42b is provided (or alternately considered, purge inlets 28b are provided) with deflectors/diverters/ramps 43 angled at an exemplary 40° from surface 42b for achieving such purge gas discharging generally in a direction "B".

Further by way of example only, FIG. 4 depicts yet another embodiment configuration for purge gas inlets 28c. Like numerals from the FIGS. 2 and 3 described embodiments are utilized where appropriate, with differences being indicated with the suffix "c", or with different numerals. In FIG. 4, deflectors 43c are depicted as curving or ramping to extend a portion thereof essentially parallel along surface 42c.

In accordance with an aspect of the invention, one preferred deposition method positions a substrate within a deposition chamber defined, at least in part, by chamber walls such as, by way of example only, substrate 25 positioned within chemical vapor deposition apparatus 10. At least one of the chamber walls comprises a chamber surface having a plurality of purge gas inlets to the chamber. For example, any multiple set or subset of purge gas inlets 28, in conjunction with the FIG. 1 described embodiment, depict such a plurality of purge gas inlets.

A process gas (i.e., in one or more flowings) is provided over the substrate effective to deposit a layer onto the substrate. In the depicted exemplary FIG. 1 embodiment, one or more process gasses could be provided via process gas inlet 18 to showerhead 27. During provision of the process gas effective to deposit a layer on the substrate, some material adheres to the chamber surface.

A reactive purge gas is emitted to the deposition chamber from purge gas inlets effective to form a reactive gas curtain over the chamber surface and away from the substrate, with such reactive gas reacting with the adhering material. In one implementation, the reactive gas flowing occurs after depositing the layer on the substrate. In one implementation, the reactive gas flowing occurs during the process gas flowing. In one implementation, the reactive purge gas is different in composition from all of the process gas. Further, the reactive gas may or may not be capable under conditions of the reactive gas flowing of reaction with the exposed layer which has or is being deposited.

By way of example only, the adhering material might be reactive with one or a multiple of the deposition precursors. In such event, it might be desirable to remove such adhering material from the substrate so it will not react with subsequent flowing precursor, or at least in some way passivate such adhering material to preclude its reaction with subsequently flowing deposition precursors. Further by way of example only, the adhering material might result, in part, from the reaction of deposition precursor with material of the chamber surface, thus forming material adhering thereto. Such might constitute a monolayer in ALD including eventually considerably thicker layers from the successive formation of repeated monolayers.

By way of example only, an exemplary adhered material might comprise oxygen atoms adhering to a metal chamber surface. Such could manifest by the feeding of ozone in any of the above-described exemplary processes involving the deposition of $Al_2O_3$. Alternately by way of example only, such might encompass any of $TiCl_2$, $TiCl_3$ and $NH_3$ complexes with respect to $TiCl_4$ and $NH_3$ deposition precursor flows.

In one aspect, the reactive gas reacts to modify the composition of the adhering material, with such modified composition material adhering to the chamber surface. By way of example only, and where the adhering material comprises $Al-(CH_3)_2$, an exemplary reactive gas would be activated hydrogen to modify the adhering material composition to Al, which still adheres to the chamber surface.

In one aspect, the reactive gas reacts to effectively remove the adhered material, and any reaction by-product thereof, from adhering to the chamber surface. For example and by way of example only, where the adhering material comprises $TiCl$, $TiCl_2$ and/or $TiCl_3$, an exemplary reactive gas includes $Cl_2$, which would effectively etch or otherwise vaporize the adhering material from the substrate and be exhausted from the chamber.

The conditions (i.e., temperature, pressure, flow rate, etc.) of the reactive gas flowing can be optimized by the artisan and are not otherwise particularly germane or preferred to any aspect of the invention. By way of example only, such conditions might be the same as, or different from, any of a first precursor gas flow, a second precursor gas flow and/or inert purge gas flow. In one aspect, the reactive gas flow is plasma-enhanced, for example either by plasma generation within the chamber, plasma generation remote of the chamber, or both.

The particular reactive gas selected, whether a single constituent or a mixture of constituents, will depend as a minimum upon at least some portion or component of the adhering material which will be capable of reaction with the reactive gas under conditions of the reactive gas flowing. By way of example only, possible reactive gas components include $Cl_2$, $O_2$ and $H_2$. For example and by way of example only where the adhering material comprises oxygen atoms, such might be removed in the presence of $O_2$ to form ozone and/or with $H_2$ to form $H_2O$ which is exhausted from the chamber.

In one preferred methodical aspect of the invention, the reactive purge gas is emitted to the chamber in a direction substantially transverse to the chamber surface associated with the purge gas inlets and, in one embodiment, is also effective to form the reactive gas curtain to comprise substantially turbulent gas flow proximate the chamber surface. In another preferred embodiment, the purge gas emitting to the chamber is in a direction substantially along the chamber surface and, in one embodiment, is additionally effective to form the reactive gas curtain to comprise substantially laminar gas flow proximate the chamber surface. In some operating regimes, viscous or turbulent flow may be desired proximate the surface being protected, whereas in other regimes laminar flow might be desired.

In one embodiment, the purge gas emitting comprises emitting a greater volume of purge gas from at least some purge gas inlets located further from the chamber outlet than from at least some purge gas inlets located closer to the chamber outlet. Such might be accommodated by providing larger outlets further from the chamber outlet than closer to the chamber outlet, and/or by providing greater flow and/or pressure to the purge gas inlets which are located further/ furthest from the chamber outlet. Preferred depositions include chemical vapor deposition, including atomic layer deposition.

The above-described exemplary embodiments/implementations were essentially in conjunction with chamber walls which effectively define a maximum internal volume within a deposition apparatus 10. FIG. 5 depicts an exemplary alternate chemical vapor deposition apparatus 10a. Like numerals from the FIG. 1 described embodiment are utilized where appropriate, with differences being indicated with the suffix "a", or with different numerals. Chemical vapor deposition apparatus 10a includes a chamber liner apparatus 50 forming a deposition subchamber 17 within chamber 15a. Chamber liner apparatus 50 comprises subchamber surfaces 51 having a plurality of purge gas inlets 52 to the subchamber therein. By way of example only, purge gas inlets 52 might be configured in any of the manners described above, including the depictions with respect to inlets 28, 28a, 28b and 28c described above. Further, liner apparatus 50 would ideally be configured or fabricated to be an easily replaceable component of apparatus 10a. By way of example only, the exemplary FIG. 5 embodiment depicts the various walls of liner apparatus 50 as comprising a retained intertwined, mesh-like material which is fed by a plurality of purge gas inlet passageways 56 for providing the desired purge gas thereto during deposition. Other preferred attributes of the method, for example as described with respect to FIGS. 1-4 above, can be incorporated with chamber liner apparatus 50.

Figure 6:
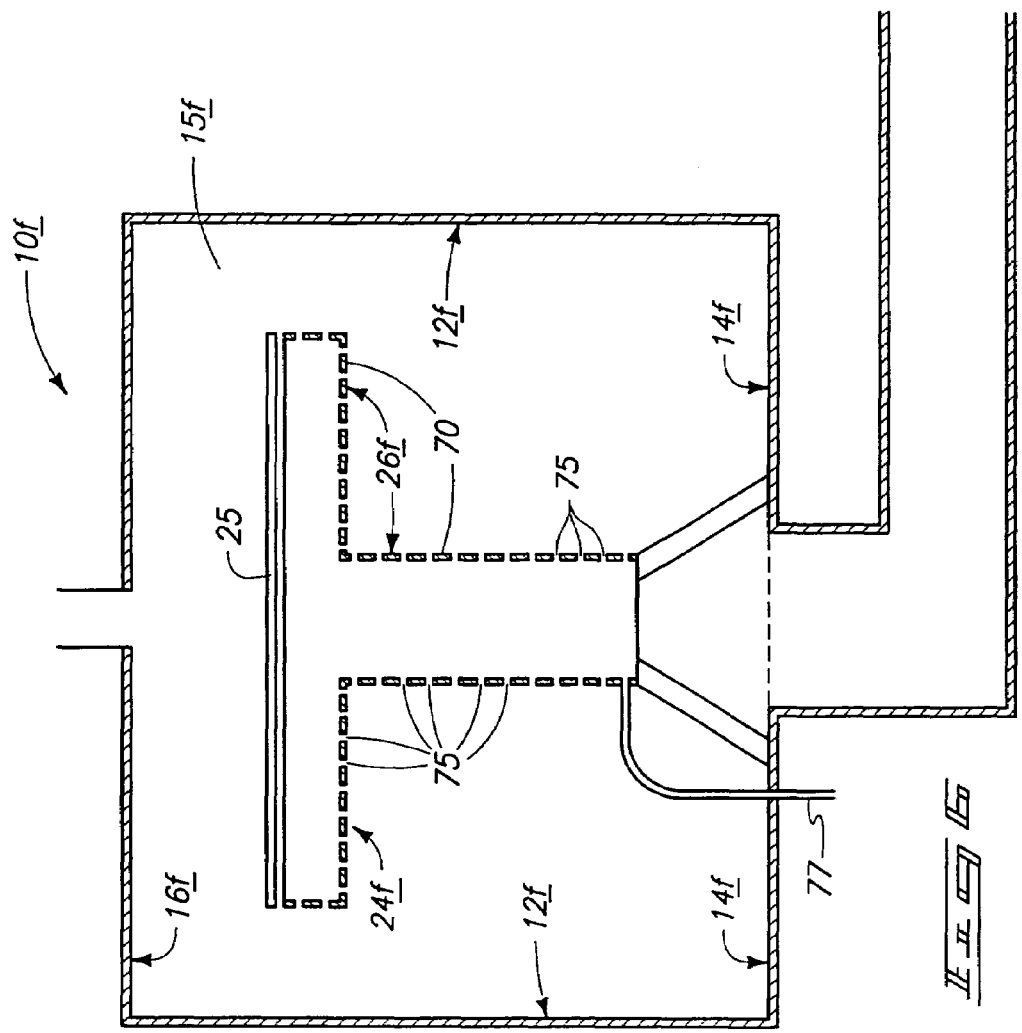
FIG. 6 is a diagrammatic sectional view of another alternate chemical vapor deposition apparatus usable in accordance with an aspect of the invention.

By way of example only, an alternate exemplary apparatus usable to practice the invention is described with reference to FIG. 6. Like numerals from the first-described embodiments are utilized where appropriate, with differences being indicated with the suffix "f", or with different numerals. FIG. 6 depicts a chemical vapor deposition apparatus 10f comprising a deposition chamber 15f which is at least in part defined by chamber walls 12f, 14f and 16f. Substrate holder 24f comprises support structure 26f. Such includes a surface or surfaces 70 exposed to chamber 15f and which comprise(s) a plurality of purge gas inlets 75 to chamber 15f. An exemplary purge gas inlet passageway 77 is shown in communication with support structure 26f, and accordingly with purge gas inlets 75. Such purge gas inlets might have any of the attributes described above with respect to the other described embodiments.

Regardless, and in accordance with another methodical implementation of the invention, a deposition method comprises positioning a substrate within a deposition chamber defined at least in part by chamber walls. The deposition chamber comprises a component received therein internally of the chamber walls. By way of example only, substrate holder 24f and its associated support structure 26f is one exemplary such component. However, any other component is contemplated in accordance with methodical aspects of the invention. The component comprises a surface, exposed to the chamber, which has a plurality of purge gas inlets to the chamber therein.

A process gas is provided over the substrate effective to deposit a layer onto the substrate. During provision of the process gas effective to deposit a layer on the substrate, some material adheres to the chamber surface.

A reactive purge gas is emitted to the deposition chamber from purge gas inlets effective to form a reactive gas curtain over the component surface and away from the substrate, with such reactive gas reacting with the adhering material. Any other attribute as described above with respect to other methodical implementation of the invention is of course contemplated.

Control of the reactive purge gas flow can be through a variety of methods, such as an active feedback control loop based on pressure sensors ported to the purge gas channels and linked to mass flow controllers, needle valves, EMCO digital valve-type flow control, line pressure regulators or other existing or yet-to-be developed methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A deposition method comprising:
positioning a substrate within a deposition chamber defined at least in part by chamber sidewalls, at least one of the chamber sidewalls comprising a chamber surface;
providing a process gas over the substrate effective to deposit a layer onto the substrate;
adhering a material to the chamber surface; and
while the substrate is within the deposition chamber, emitting reactive purge gas to the deposition chamber effective to form a reactive gas curtain over the chamber surface and away from the substrate, with such reactive gas reacting with such adhering material.

2. The method of claim 1 wherein the emitting occurs after the providing.

3. The method of claim 1 wherein the reactive purge gas is different in composition from all said process gas.

4. The method of claim 1 wherein the reactive purge gas reacts to modify composition of the adhering material, with such modified composition material adhering to the chamber surface.

5. The method of claim 1 wherein the reactive purge gas reacts to effectively remove such material, and any reaction by-product thereof, from adhering to the chamber surface.

6. The method of claim 1 comprising emitting the reactive purge gas to the chamber in a direction substantially transverse to the chamber surface and effective to form the reactive gas curtain to comprise substantially turbulent gas flow proximate the chamber surface.

7. The method of claim 1 comprising emitting the reactive purge gas to the chamber in a direction substantially along the chamber surface and effective to form the reactive gas curtain to comprise substantially laminar gas flow proximate the chamber surface.

8. The method of claim 1 wherein the deposition chamber includes an outlet therefrom, the emitting comprises emitting a greater volume of reactive purge gas at some locations further from the chamber outlet than at some locations closer to the chamber outlet.

9. The method of claim 1 wherein the chamber sidewall having the chamber surface comprises a surface of a chamber liner apparatus forming a deposition subchamber within the chamber.

10. The method of claim 1 comprising chemical vapor deposition.

11. The method of claim 10 comprising atomic layer deposition.

12. The method of claim 1 wherein the reactive purge gas is plasma enhanced.

13. The method of claim 1 wherein the reactive purge gas is plasma enhanced by plasma generation within the chamber.

14. The method of claim 1 wherein the reactive purge gas is plasma enhanced by plasma generation remote of the chamber.

15. A deposition method comprising:
positioning a substrate within a deposition chamber defined at least in part by chamber walls, at least one of the chamber walls comprising a chamber surface;
providing a process gas over the substrate effective to deposit a layer onto the substrate;
adhering a material to the chamber surface; and
during such providing, emitting reactive purge gas to the deposition chamber effective to form a reactive gas curtain over the chamber surface and away from the substrate, with such reactive purge gas reacting with such adhering material, the reactive purge gas being different in composition from all said process gas.

16. The method of claim 15 comprising emitting the reactive purge gas to the chamber in a direction substantially transverse to the chamber surface and effective to form the reactive gas curtain to comprise substantially turbulent gas flow proximate the chamber surface.

17. The method of claim 15 comprising emitting the reactive purge gas to the chamber in a direction substantially along the chamber surface and effective to form the reactive gas curtain to comprise substantially laminar gas flow proximate the chamber surface.

18. The method of claim 15 wherein the deposition chamber includes an outlet therefrom, the emitting comprises emitting a greater volume of reactive purge gas at some locations further from the chamber outlet than at some locations closer to the chamber outlet.

19. The method of claim 15 wherein the chamber wall having the chamber surface comprises a surface of a chamber liner apparatus forming a deposition subchamber within the chamber.

20. The method of claim 15 comprising chemical vapor deposition.

21. The method of claim 20 comprising atomic layer deposition.

22. The method of claim 15 wherein the reactive purge gas is plasma enhanced.

23. The method of claim 15 wherein the reactive purge gas is plasma enhanced by plasma generation within the chamber.

24. The method of claim 15 wherein the reactive purge gas is plasma enhanced by plasma generation remote of the chamber.

25. A deposition method comprising:
positioning a substrate within a deposition chamber defined at least in part by chamber walls, the deposition chamber comprising a component received therein internally of the chamber walls, the component comprising a surface exposed to the chamber;
providing a process gas over the substrate effective to deposit a layer onto the substrate;
adhering a material to the component surface;
during such providing, emitting reactive purge gas to the deposition chamber effective to form a reactive gas curtain over the component surface within the deposition chamber and away from the substrate, with such reactive gas reacting with such adhering material, the reactive purge gas being different in composition from all said process gas.

26. The method of claim 25 wherein the component comprises a portion of a substrate support received internally of the chamber walls.

27. The method of claim 25 comprising emitting the reactive purge gas to the chamber in a direction substantially transverse to the surface and effective to form the reactive gas curtain to comprise substantially turbulent gas flow proximate the surface.

28. The method of claim 25 comprising emitting the reactive purge gas to the chamber in a direction substantially along the surface and effective to form the reactive gas curtain to comprise substantially laminar gas flow proximate the surface.

29. The method of claim 25 wherein the deposition chamber includes an outlet therefrom, the emitting comprises emitting a greater volume of reactive purge gas at some locations further from the chamber outlet than at some locations closer to the chamber outlet.

30. The method of claim 25 comprising chemical vapor deposition.

31. The method of claim 30 comprising atomic layer deposition.

32. The method of claim 25 wherein the reactive purge gas is plasma enhanced.

33. The method of claim 25 wherein the reactive purge gas is plasma enhanced by plasma generation within the chamber.

34. The method of claim 25 wherein the reactive purge gas is plasma enhanced by plasma generation remote of the chamber.

* * * * *